United States Patent [19]

Kato

[11] Patent Number: 5,796,753
[45] Date of Patent: Aug. 18, 1998

[54] HIGH SPEED TEST PATTERN TRANSFER APPARATUS FOR SEMICONDUCTOR TEST SYSTEM

[75] Inventor: Yoshiaki Kato, Saitama, Japan

[73] Assignee: Advantest Corp., Tokyo, Japan

[21] Appl. No.: 700,451

[22] PCT Filed: Dec. 26, 1995

[86] PCT No.: PCT/JP95/02692

§ 371 Date: Nov. 18, 1996

§ 102(e) Date: Nov. 18, 1996

[87] PCT Pub. No.: WO96/20409

PCT Pub. Date: Jul. 4, 1996

[30] Foreign Application Priority Data

Dec. 28, 1994 [JP] Japan .................. 6-338918

[51] Int. Cl.6 ............................ G06F 11/00
[52] U.S. Cl. .................. 371/27.1; 395/183.22
[58] Field of Search ................ 371/27.1, 21.1, 371/27.5; 395/183.18, 183.22

[56] References Cited

U.S. PATENT DOCUMENTS 5,243,274  9/1993  Kelsey et al. .................. 324/158 R
5,265,102  11/1993  Saito .................. 371/27
5,524,208  6/1996  Finch et al. .................. 395/183.01

FOREIGN PATENT DOCUMENTS 61-59558  3/1986  Japan .
4-62486  2/1992  Japan .
5-126915  5/1993  Japan .

*Primary Examiner*—Hoa T. Nguyen
*Attorney, Agent, or Firm*—Muramatsu & Associates

[57] ABSTRACT

A test pattern transfer apparatus is to improve overall throughput of a semiconductor test system which has an engineering work station for functioning as a host computer, a test controller for controlling an operation of the semiconductor test system and a pattern memory for generating test patterns transferred from a hard disk of the engineering work station. The test pattern transfer apparatus simplifies the pathways for transferring the test patterns so as to reduce the time required for the pattern transfer by directly transferring the test pattern from the work station to the pattern memory without passing through the test controller. The test pattern transfer apparatus includes an interface controller whereby the test pattern from the engineering work station is either directly transferred to the pattern memory or indirectly transferred to the pattern memory through the test controller.

6 Claims, 5 Drawing Sheets

HIGH SPEED TEST PATTERN TRANSFER APPARATUS FOR SEMICONDUCTOR TEST SYSTEM

FIELD OF THE INVENTION

This invention relates to a high speed transfer apparatus for transferring test patterns from a host computer to a pattern memory in a semiconductor test system.

BACKGROUND OF THE INVENTION

In a semiconductor test system, a large amount of test patterns to be used for semiconductor testing are read out from a disk drive of a work station and transferred to a pattern memory every time when the test items for an LSI are changed.

A conventional method, used in such a semiconductor test system, for transferring the test patterns from the disk drive of the work station to the pattern memory in a buffer memory will be described in the following with reference to FIGS. 3–5.

As shown in FIG. 3, the conventional semiconductor test system is comprised of an EWS (Engineering Work Station) 12, a tester controller 13 and a buffer memory 14. These three components are situated apart with certain distances from each other and connected by bus cables which interfere therebetween.

The EWS 12 is mainly utilized as a host computer for producing test patterns and performing debugging. The EWS 12 includes a disk drive 11 which is a large capacity storage medium to store the test patterns generated by the EWS 12.

The tester controller 13 is a control processor which manages the semiconductor test system itself.

A pattern memory 14b is a high speed memory which stores a test pattern 100 for testing an LSI which is transferred from the EWS 12. The pattern memory 14b applies the test pattern 100 to a device under test.

Reference numerals 12c, 13c, 13d and 14a are interface circuits which deal with differences in the format or speed of data between the bus cables in which data is transferred. The EWS 12 includes a temporary buffer memory 12b. The tester controller 13 includes a temporary buffer memory 13b.

The test pattern 100 is transferred from the disk drive 11 in the EWS 12 to a pattern memory 14b of the buffer memory 14 through pathways described in the following.

Namely, the test pattern 100 stored in the disk drive 11 is transferred to the memory 12b in the EWS 12 via a pathway 15 through the interface 12a.

Then, via a pathway 42, the test pattern 100 is transferred from the memory 12b to the memory 13b in the tester controller 13 through the interfaces 12c and 13c.

Next, via a pathway 43, the test pattern 100 is transferred from the memory 13b to the memory 14b in the buffer memory 14 through the interfaces 13d and 14a.

The data transfer by means of the pathway 15 includes the memory read-out from the disk drive 11 to the memory 12b through the interface 12a.

There are two ways to transfer the data by reading and writing in the memory 12b of the EWS 12 to the memory 13b of the tester controller 13 through the pathway 42 as follows:

(i) Data transfer by means of a program I/O in the EWS 12.
(ii) Data transfer from the EWS 12 to the test controller 13 by means of a DMA (Direct Memory Access) hardware.

FIG. 4 explains the hardware structure with respect to the above data transfer (i) and (ii).

In the case of (i), a map register 13f is utilized for the data transfer which is performed by the program I/O. The map register 13f holds an offset value relative to the memory 13b of the test controller 13 viewing from a CPU 12d of the EWS 12. When accessing the memory 13b of the test controller 13 by the CPU 12d of the EWS 12, this offset value is added to an address coming from the EWS 12 side and transmitted to the address bus B; then, data of the memory 12b is transferred to the memory 13b.

In the case of (ii) for the direct memory access, a DMA address counter 12e and a DMA address counter 13e are utilized for the data transfer.

The DMA address counter 12e is used for the read-out and write-in access of the memory 12b. Before the direct memory access is taken place, the CPU 12d stores a start address of the memory 12b in the DMA address counter 12e through the data bus A and determines a number of words to be transferred. When the CPU 12d initiates the direct memory access, the DMA address counter 12e increments an address value which corresponds to the number of words per one time for the address bus A every time when one cycle of the DMA transfer is completed. This incrementing process is continued until the transfer for all of the predetermined number of words is completed. After the transfer of the predetermined number of words is performed, the data transfer by means of the DMA transfer is completed by interrupting the CPU 12d and notifying the completion of the process.

The DMA address counter 13e is used in the read-out and write-in access of the memory 13b of the tester controller 13. The CPU 12d of the EWS 12 stores a start address of the memory 13b in the DMA address counter 13e through the data bus A before the direct memory access is started. When the CPU 12d of the EWS 12 initiates the direct memory access, the DMA address counter 12e increments an address value for the address bus A every time when one cycle of the DMA transfer is completed, in synchronism with the DMA address counter 12e, wherein the address value corresponds to the number of words per each time. The difference from the DMA address counter 12e is that there is no prearrangement of the data size. Thus the data transfer by means of the DMA transfer is completed by a control signal transmitted from the DMA address counter 12e.

In FIG. 3, there are two ways of the reading and writing access for the memory 14b of the buffer memory 14 by the memory 13b of the tester controller 13 through the pathway 43 as follows:

(iii) Data transfer by means of a program I/O in the test controller 13.
(iv) Data transfer between the test controller 13 and buffer memory 14 by means of DMA (Direct Memory Access) hardware.

FIG. 5 explains the hardware structure with respect to the above (iii) and (iv) situations.

In the case of (iii), a map register 13j operates in a similar manner as the map register 13f in FIG. 4 whereby the data transfer is taken place by means of the program I/O.

In the case of (iv), a DMA address counter 13g and a DMA address counter 13h operate in a similar manner as the DMA address counter 12e and the DMA address counter 13e in FIG. 4 whereby the data transfer is taken place by means of the DMA.

As in the foregoing, the test pattern 100 of the disk drive 11 is read out by the memory 12b of the EWS 12 and transferred to the memory 13b of the tester controller 13;

then the test pattern is transferred to the pattern memory 14*b* of the buffer memory 14. If the volume of the tester pattern is small, the data transfer time is short in comparison with the testing time of the LSI. Thus, the access time for the reading and writing process is will not be affected by the data transfer. However, the volume of the test pattern has been largely increased with the recent increase of the density in the LSI. Accordingly, the reading and writing access time in the transfer time relative to the LSI testing time has been greatly increased, resulting the lowered throughput.

SUMMARY OF THE INVENTION

Therefore, it is an object of the present invention to shorten the data transfer time by minimizing the transfer route for the test patterns so as to improve the throughput of the semiconductor test system.

In the present invention, the test pattern 100 from the engineering work station EWS 12 is either directly transferred to the buffer memory 14 through an interface 13*a* or indirectly transferred to the buffer memory 14 through the interface 13*a* and the test controller 13.

The present invention realizes a high speed test pattern transfer apparatus to be used in the semiconductor test system. The test pattern transfer apparatus comprising: the engineering work station EWS 12; the tester controller 13; the buffer memory 14; the interface 12*c* provided in the EWS 12 for interfacing with the tester controller 13; the interface 14*a* provided in the buffer memory 14 for interfacing with the tester controller 13, wherein, data in the memory 12*b* can be directly transferred to the pattern memory 14*b*, between the tester pattern 100 stored in the disk drive 11 in the EWS 12 and buffer memory 14, without temporarily transferring the data to the memory 13*b*.

The interface 13*a* consists of: an arbiter 13*k* that controls the simultaneous access and data flows; multiplexers MUXA 13*n* and MUXB 13*p*; DMA address counters 13*e*, 13*g* and 13*h* and map registers 13*f* and 13*j* that transfer data stored in the memory 12*b* of the EWS 12 to the memory 13*b* of the tester controller 13, and, further transfer the data in the memory 13*b* to the pattern memory 14*b* of the buffer memory 14; a DMA address counter 13*r* and map register 13*m* for directly transferring the data in the memory 12*b* to the pattern memory 14*b*.

In the high speed transfer system of the present invention, the test pattern 100 stored in the memory 12*b* of the EWS 12 is transferred through a pathway 16 as follows: when the data is transferred by the program I/O, an address of the map register 13*m* is arranged to be offset relative to the address bus C, viewing from the program I/O of the EWS 12.

With respect to the DMA transfer operation through the pathway 16, the DMA address counter 13*r* is utilized for an access of the pattern memory 14*b* of the buffer memory. Then, an input (a) is selected in the multiplexer MUXA 13*n*. Similarly, an input (a) is selected in the multiplexer MUXB 13*p*. Since the tester pattern data is directly transferred to the pattern memory 14*b* of the buffer memory 14 without being transferred to the memory 13*b* of the tester controller 13, the high speed data transfer is thereby achieved.

Since the arbiter 13*k*, multiplexers MUXA 13*n* and MUXB 13*p* function to control the simultaneous access operations and data flows of the data transfer pathways 16, 42 and 43, the data transfer is smoothly performed without causing the EWS 12, tester controller 13 and buffer memory 14 to be affected each other.

PREFERRED EMBODIMENT OF THE PRESENT INVENTION

The present invention will be discussed with reference to FIG. 1 and 2 in the following.

Figure 1:
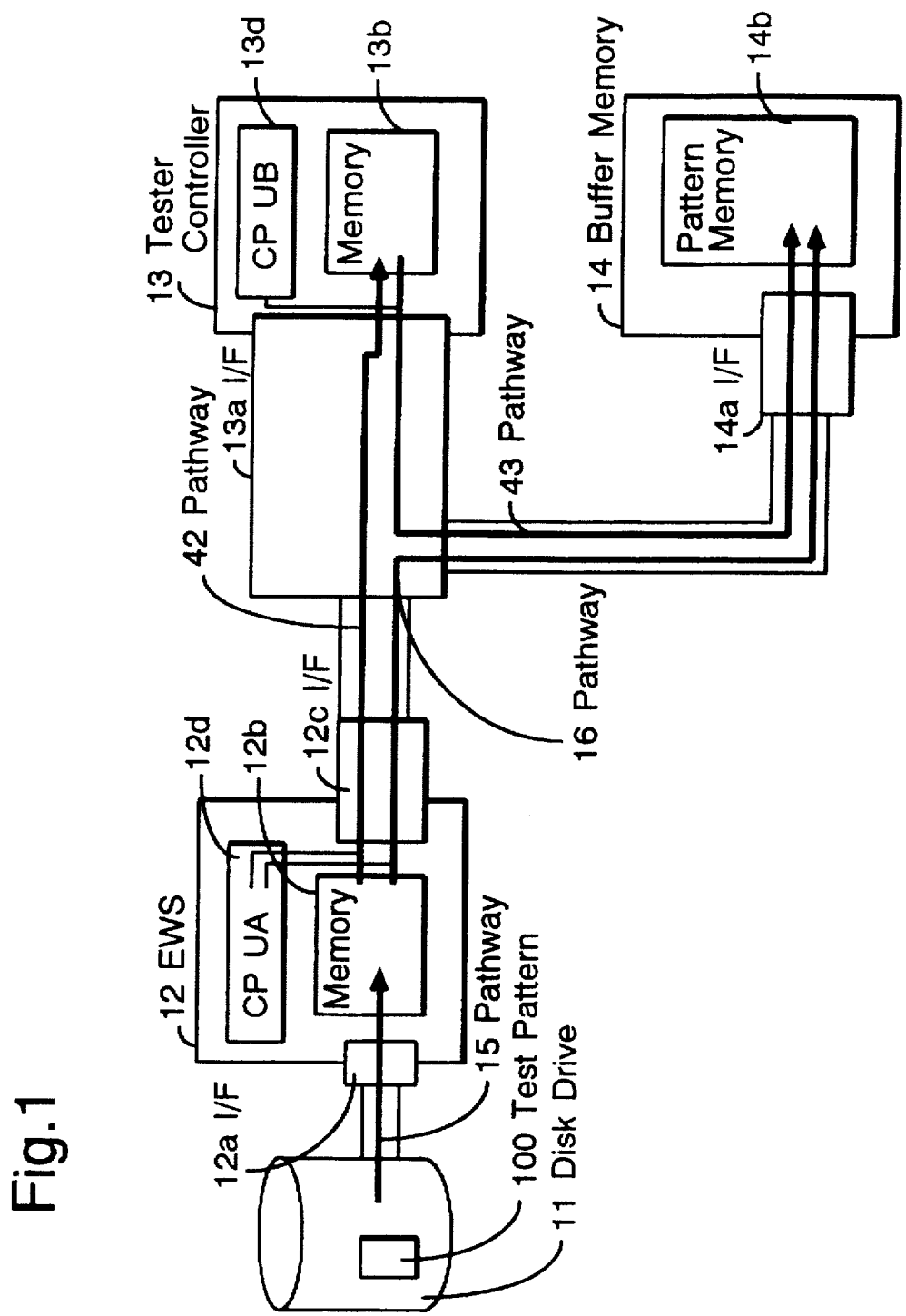
FIG. 1 is a block diagram showing the data transfer pathways of the present invention.

FIG. 1 shows the relationship between the data transfer pathways 16, 42 and 43 according to the present invention.

Figure 3:
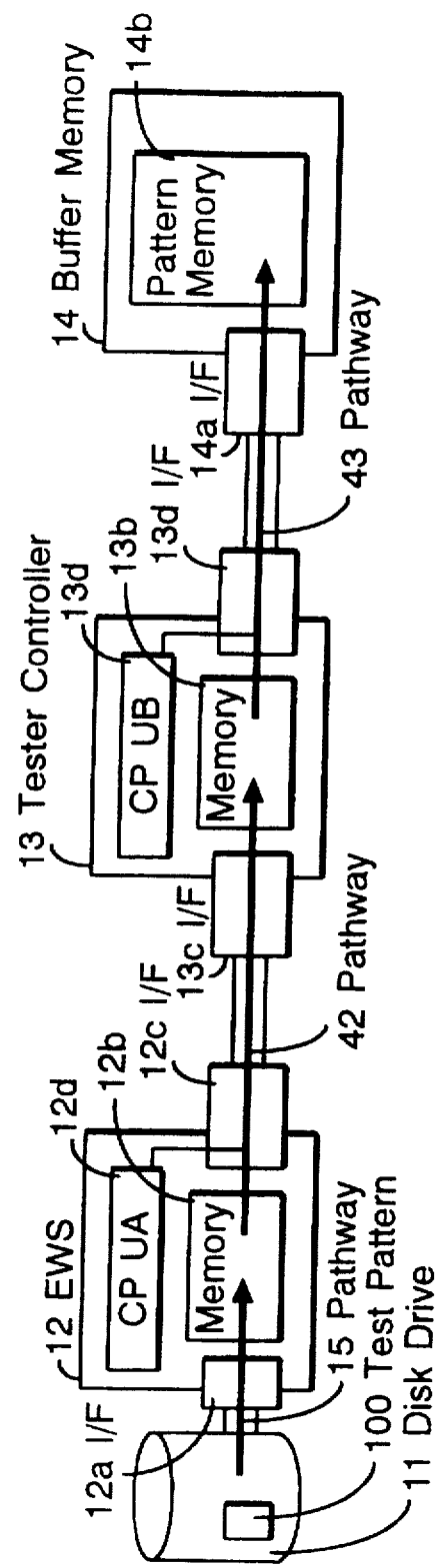
FIG. 3 is a block diagram showing the data transfer pathways of the prior art.
Figure 4:
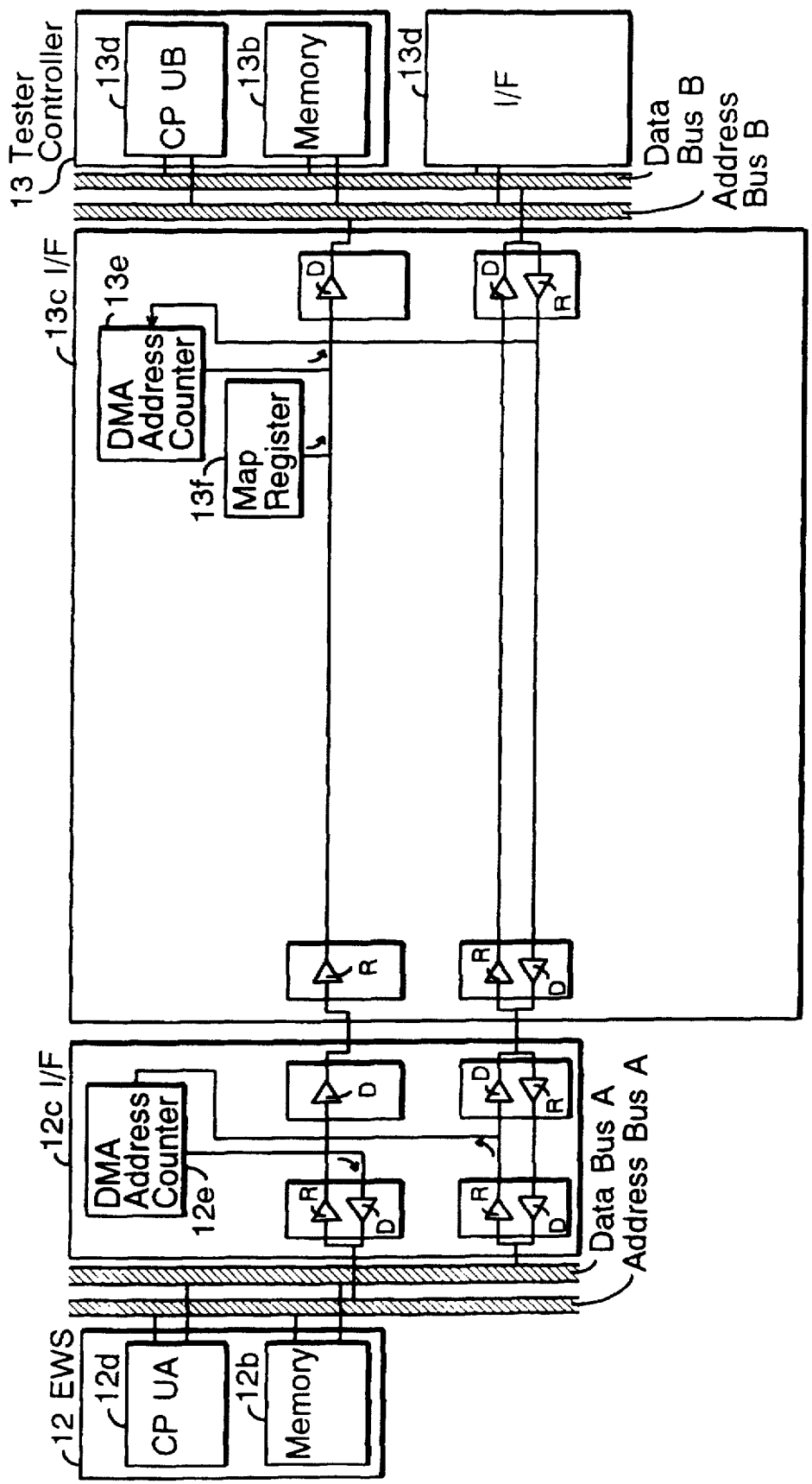
FIG. 4 is a detailed block diagram showing an example of the interface in the data transfer of the prior art.
Figure 5:
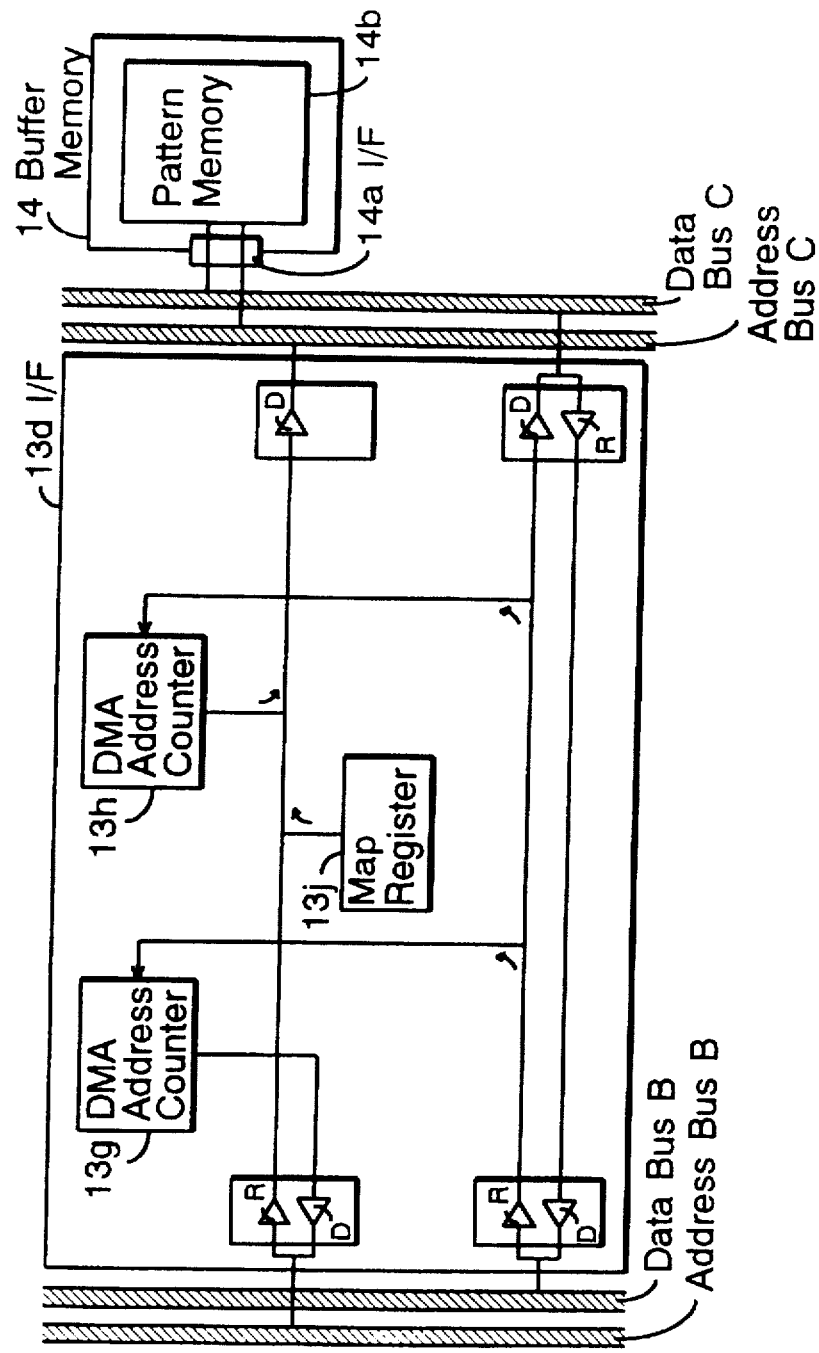
FIG. 5 is a detailed block diagram showing another example of the interface in the data transfer of the prior art.

The only difference from the prior art resides in the interface 13*a* which performs the functions of the interfaces 13*c* and 13*d* in the prior art of FIGS. 3–5.

In the present invention, the following data transfer operations as stated in (1)–(6) can be achieved by means of the interface 13*a*. In this case, the operations (1)–(4) are the same operations which are conducted by the pathways 42 and 43 in the prior art. The operations (5) and (6) are the high speed data transfer by means of the pathway 16, which are newly added to the present invention.

(1) Data transfer by the program I/O in the EWS 12.
(2) Data transfer between the EWS 12 and tester controller 13 by means of the DMA (Direct Memory Access) hardware.
(3) Data transfer by the program I/O in the tester controller 13.
(4) Data transfer between the tester controller 13 and buffer memory 14 by means of the DMA hardware.
(5) Data transfer between the EWS 12 and the buffer memory 14 by means of the program I/O.
(6) Data transfer between the EWS 12 and the buffer memory 14 by means of the DMA hardware.

Figure 2:
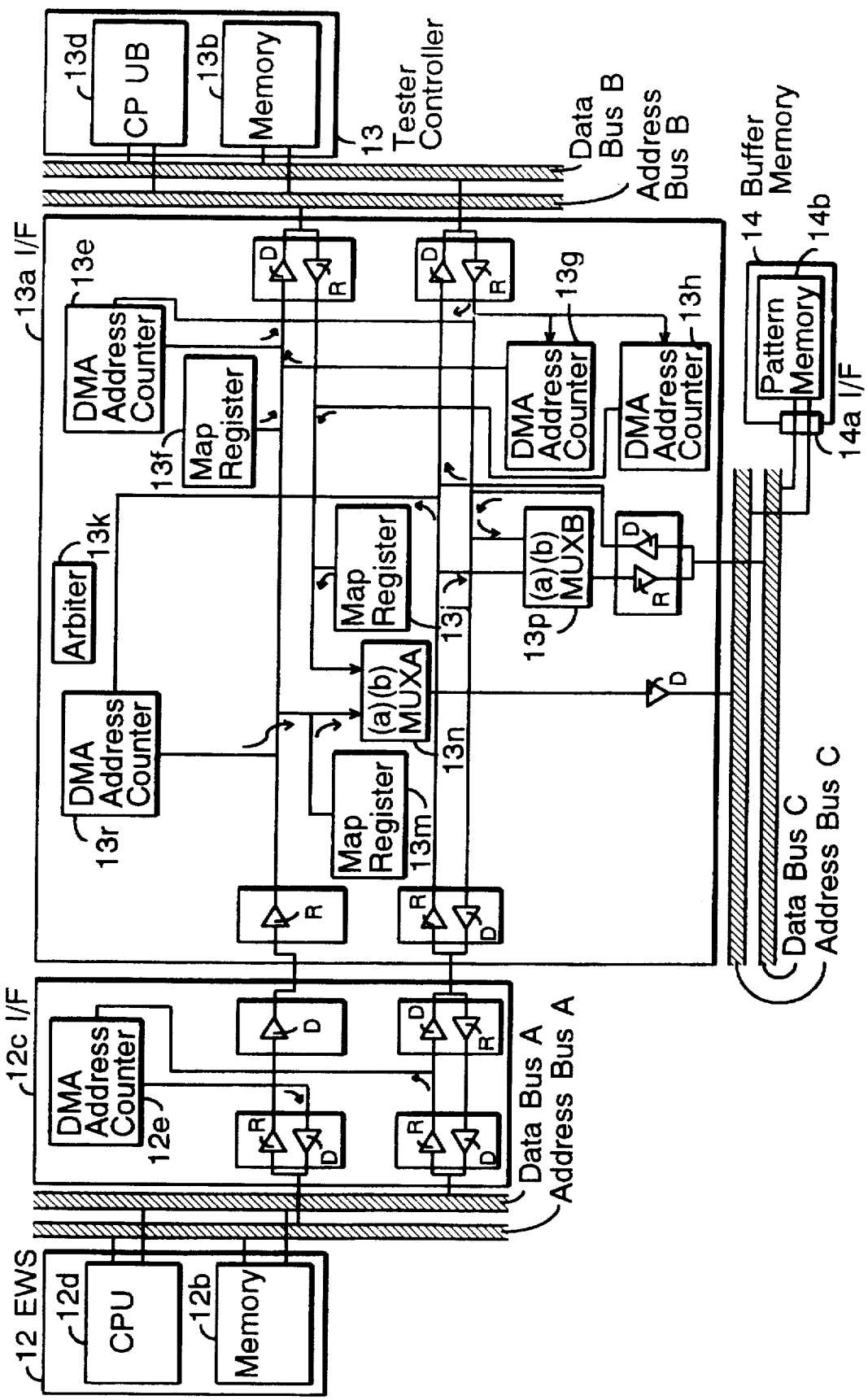
FIG. 2 is a detailed block diagram showing an example of the interface for the data transfer in the present invention.

The structure of the interface 13*a* of the present invention is discussed in detail in FIG. 2.

The interface 13*a* consists of the DMA address counters 13*e*, 13*g*, and 13*h* and map registers 13*f* and 13*j* all of which are conventionally known, and newly added components of an arbiter 13*k*, a DMA address counter 13*r*, a map register 13*m* and multiplexers MUXA 13*n* and MUXB 13*p*.

The arbiter 13*k* and multiplexers 13*n* and 13*p* control the simultaneous access and address and data flows according to the priority of the data transfer as described in the above data transfer (1)–(6).

The DMA address counter 13*r* is utilized for the DMA transfer between the memory 12*b* of the EWS 12 and buffer 14. The DMA address counter 13*r* has an identical function to the DMA address counter 13*e*.

An address offset with respect to the program I/O of the EWS 12 is provided for the map register 13*m* relative to the address bus C thereby the map register 13*m* is used for the data transfer by means of the program I/O in the data transfer (5).

The MUXA 13*n* multiplexes the address data. An input (a) of the MUXA 13*n* is selected when the data transfer operations as noted in (5) and (6) are taken place. And an input (b) of the MUXA 13*n* is selected when the data transfer operations of (1)–(4) are taken place.

Conversely, the MUXB 13*p* multiplexes the data. An input (a) of the MUXB 13*p* is selected when the data transfer operations noted in (5) and (6) are taken place. An input (b) is selected when the data transfer operations of (1)–(4) are taken place.

When the data transfer operations of (1)–(4) are taken place, the input (b) is selected in each of the MUXA 13*n* and MUXB 13p. The data transfer operations of (1)–(4) use the conventional DMA address counters 13e, 13g and 13h and the map registers 13f and 13j, wherein these elements operate as described in the conventional invention.

The data transfer operations of the present invention in (5)–(6) are described in the following.

As in FIG. 1, the test pattern 100 which is read out in the memory 12b of the EWS 12 is transferred to the pattern memory 14b of the buffer memory 14 through the pathway 16 by means of the above data transfer operations (5)–(6). Namely, in case of the program I/O in the operation (5), the offset stored in the map register 13m is added to the address of the memory 12b of the EWS 12. Then, the input (a) is selected in the MUXA 13n and MUXB 13p, and the test pattern 100 is transferred in high-speed to the pattern memory 14b of the buffer memory 14. In case of the DMA transfer in the operation (6), the DMA address counter 12e is used to access the memory 12b of the EWS 12. The DMA address counter 13r is used to access the pattern memory 14b of the buffer memory 14. Then, the input (a) is selected in the MUXA 13n and MUXB 13p and the test pattern 100 is transferred in high-speed.

In the foregoing, although the test pattern 100 is used as data to be transferred, it is possible to adopt other data. Moreover, although the data is transferred to the pattern memory 14b of the buffer memory 14, it is apparent that other storage medium can equally be used for the data transfer of the present invention.

Since the present invention is structured as has been described in the foregoing, it has the following effects.

Namely, in the conventional invention, the tester pattern stored in the memory of the EWS of the host computer is first transferred to the memory of the test processor and then transferred to the pattern memory of the buffer memory. If the volume of the test patterns of the LSI is large, the conventional process is disadvantageous because it takes too long a time to transfer the test patterns relative to the overall testing time. Thus, the present invention provides the pathway that can directly transfer the test pattern from the memory of EWS in the host computer to the pattern memory in the buffer memory without making an access to the memory of the test processor, in addition to the conventional pathways. Furthermore, the address counter and the map register are added thereto in order to transfer the test pattern data directly to the buffer memory. Moreover, the arbiter and multiplexers are provided in order to control the simultaneous access according to the priority of the added transfer pathway and the address and data flows. Therefore, the present invention is able to achieve the high-speed transfer of the pattern data.

Thus, the present invention has an advantage that the transfer pathways for the test pattern in the semiconductor test system are more simplified than the conventional invention so as to improve the throughput of the semiconductor testing by shortening the data transfer time.

What is claimed is:

1. A high speed test pattern transfer apparatus for a semiconductor test system, comprising:

an engineering work station EWS (12) which functions as a host computer of said semiconductor test system;

a tester controller (13) which receives data from said EWS (12) and controls a test operation of said semiconductor test system;

a buffer memory (14) provided in said semiconductor test system for storing test patterns (100) produced by said EWS (12) and generating said test patterns to apply said test patterns (100) to a semiconductor device under test;

a first interface (12c) provided in said EWS (12) for interfacing between said EWS (12) and said tester controller (13);

a second interface (14a) provided in said buffer memory (14) for interfacing between said tester controller (13) and said buffer memory (14); and a third interface (13a) provided in said tester controller (13) and arranged such that:

said test patterns (100) in said EWS (12) are either directly transferred to the buffer memory (14) through said third interface (13a) or indirectly transferred to said buffer memory (14) through said third interface (13a) and said tester controller (13).

2. A high speed test pattern transfer apparatus of claim 1, wherein said third interface (13a) comprising:

an arbiter (13k) for monitoring data flow in said third interface (13a) and controlling simultaneous access and data flow between said EWS (12), said tester controller (13) and said buffer memory (14);

multiplexer means (13n, 13p) for switching between said test patterns transmitted directly from said EWS (12) and indirectly from said tester controller (13) to be supplied to said buffer memory (14);

DMA address counters (13e, 13g and 13h), and map registers (13f, 13j), for transferring data stored in a memory (12b) of said EWS (12) to a memory (13b) of said tester controller (13), and, further, transferring the data in said memory (13b) to a pattern memory (14b) of said buffer memory (14); and a DMA address counter (13r) and a map register (13m) for directly transferring the data in said memory (12b) to said pattern memory (14b).

3. A high speed test pattern transfer apparatus of claim 1, wherein said test patterns (100) are transferred from said EWS (12) to said tester controller (13) and from said tester controller (13) to said buffer memory (14) either by a program transfer process or a direct memory access (DMA) process.

4. A high speed test pattern transfer apparatus of claim 1, wherein said test patterns (100) are transferred from said EWS (12) to said buffer memory (14) either by a program transfer process or a direct memory access (DMA) process.

5. A high speed test pattern transfer apparatus of claim 1, wherein said third interface (13a) comprising:

multiplexer means (13n, 13p) for switching between said test patterns transmitted directly from said EWS (12) and indirectly from said tester controller (13) to be supplied to said buffer memory (14);

an address counter (13r) for directly transferring said test patterns from said EWS (12) to said buffer memory (14) through a first state of said multiplexer means by a direct memory access (DMA) process; and a map register (13m) for directly transferring said test patterns from said EWS (12) to said buffer memory (14) through said first state of said multiplexer means by a program transfer process.

6. A high speed test pattern transfer apparatus of claim 5, wherein said third interface (13a) further comprising:

address counters (13e, 13g, 13h) for transferring said test patterns from said EWS (12) to said tester controller (13) and from said tester controller (13) to said buffer memory (14) through a second state of said multiplexer means by said direct memory access (DMA) process; and map registers (13f, 13j) for transferring said test patterns from said EWS (12) to said tester controller (13) and from said tester controller (13) to said buffer memory (14) through said second state of said multiplexer means by said program transfer process.

* * * * *